(12) United States Patent
Emori et al.

(10) Patent No.: US 11,953,710 B2
(45) Date of Patent: Apr. 9, 2024

(54) DISPLAY PANEL, DISPLAY DEVICE, AND METHOD FOR SORTING PHASE DIFFERENCE LAYER OF DISPLAY PANEL

(71) Applicant: DAI NIPPON PRINTING CO., LTD., Tokyo (JP)

(72) Inventors: Satoshi Emori, Seoul (KR); Takashi Kuroda, Moriya (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 820 days.

(21) Appl. No.: 17/032,483

(22) Filed: Sep. 25, 2020

(65) Prior Publication Data
US 2021/0181398 A1 Jun. 17, 2021

Related U.S. Application Data

(63) Continuation of application No. PCT/JP2019/013561, filed on Mar. 28, 2019.

(30) Foreign Application Priority Data

Mar. 28, 2018 (JP) ................................ 2018-063165

(51) Int. Cl.
*G02B 5/30* (2006.01)
*C09K 19/34* (2006.01)
(Continued)

(52) U.S. Cl.
CPC ........ *G02B 5/3083* (2013.01); *C09K 19/3477* (2013.01); *C09K 19/3491* (2013.01);
(Continued)

(58) Field of Classification Search
CPC .. G02B 5/3016; G02B 5/3033; G02B 5/3083; G02F 1/133633; G02F 1/133638;
(Continued)

(56) References Cited

U.S. PATENT DOCUMENTS

2003/0218807 A1 11/2003 Handa et al.
2016/0025913 A1 1/2016 Oh et al.
(Continued)

FOREIGN PATENT DOCUMENTS

JP 2003-302503 10/2003
JP 2007-080604 3/2007
(Continued)

OTHER PUBLICATIONS

WO 2017110332 (Year: 2017).*
(Continued)

*Primary Examiner* — Ahmed N Sefer
(74) *Attorney, Agent, or Firm* — Hamre, Schumann, Mueller & Larson, P.C.

(57) ABSTRACT

The present invention provides a display panel in which deterioration of color tone may be suppressed regardless of the reflectance of the display element.
A display panel including a display element (A), a retardation layer (B) positioned upon the light emission surface side of the display element, and a polarizer (C) positioned upon the light emission surface side of the retardation layer, in which the retardation layer (B) has a $\lambda/4$ retardation layer (B1), and the in-plane retardation of the $\lambda/4$ retardation layer (B1) satisfies the following Condition 1:
<Condition 1>
The spectral reflectance of the display element is measured by an SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the $\lambda/4$ retardation layer falls within the range of $-4.6002x+119.24$ nm or more and $-4.6002x+129.24$ nm or less.

7 Claims, 4 Drawing Sheets

(51) Int. Cl.
| | |
|---|---|
| *C09K 19/38* | (2006.01) |
| *C09K 19/54* | (2006.01) |
| *C09K 19/58* | (2006.01) |
| *H10K 50/11* | (2023.01) |
| *H10K 50/84* | (2023.01) |
| *H10K 50/858* | (2023.01) |
| *H10K 50/86* | (2023.01) |
| *H10K 85/00* | (2023.01) |
| *G02F 1/13363* | (2006.01) |
| *H01L 25/075* | (2006.01) |

(52) U.S. Cl.
CPC ...... *C09K 19/3857* (2013.01); *C09K 19/3861* (2013.01); *C09K 19/544* (2013.01); *C09K 19/586* (2013.01); *G02B 5/3016* (2013.01); *H10K 50/11* (2023.02); *H10K 50/84* (2023.02); *H10K 50/858* (2023.02); *H10K 50/86* (2023.02); *H10K 85/731* (2023.02); *G02F 1/133633* (2021.01); *G02F 1/133638* (2021.01); *H01L 25/075* (2013.01)

(58) Field of Classification Search
CPC ..... G02F 2202/40; G09F 9/00; H01L 25/075; H01L 25/0753; H05B 33/02; H10K 50/86; H10K 59/00
See application file for complete search history.

(56) References Cited

U.S. PATENT DOCUMENTS

| | | | |
|---|---|---|---|
| 2016/0308170 A1 | 10/2016 | Km et al. | |
| 2017/0153370 A1* | 6/2017 | Maruyama | C09K 19/3823 |
| 2018/0155511 A1* | 6/2018 | Takeda | G02B 5/3083 |

FOREIGN PATENT DOCUMENTS

| | | |
|---|---|---|
| JP | 2007-294421 | 11/2007 |
| JP | 2012-027322 | 2/2012 |
| JP | 2013-092632 | 5/2013 |
| JP | 2015-057666 | 3/2015 |
| JP | 2016-192363 | 11/2016 |
| JP | 2017-138401 | 8/2017 |
| WO | 2002/033451 | 4/2002 |
| WO | 2014/073616 | 5/2014 |

OTHER PUBLICATIONS

WO 2017111034 (Year: 2017).*
International Search Report of PCT/JP2019/013561, dated May 28, 2019, 5 pages including English translation of the International Search Report.

* cited by examiner

[Fig. 1]
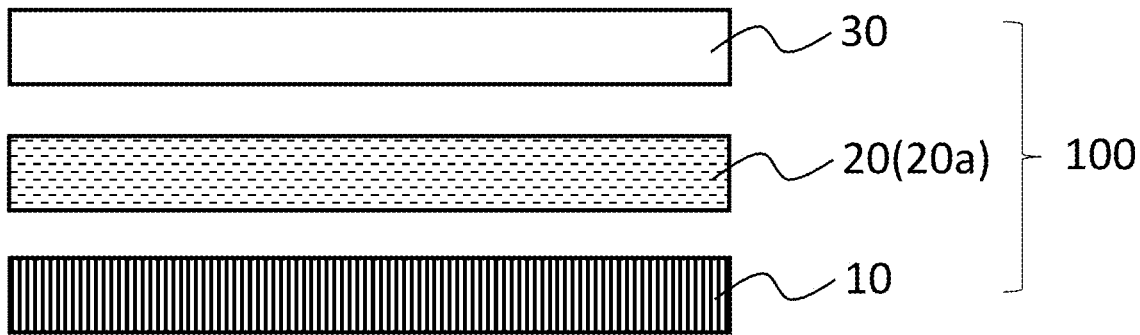
[Fig. 2]
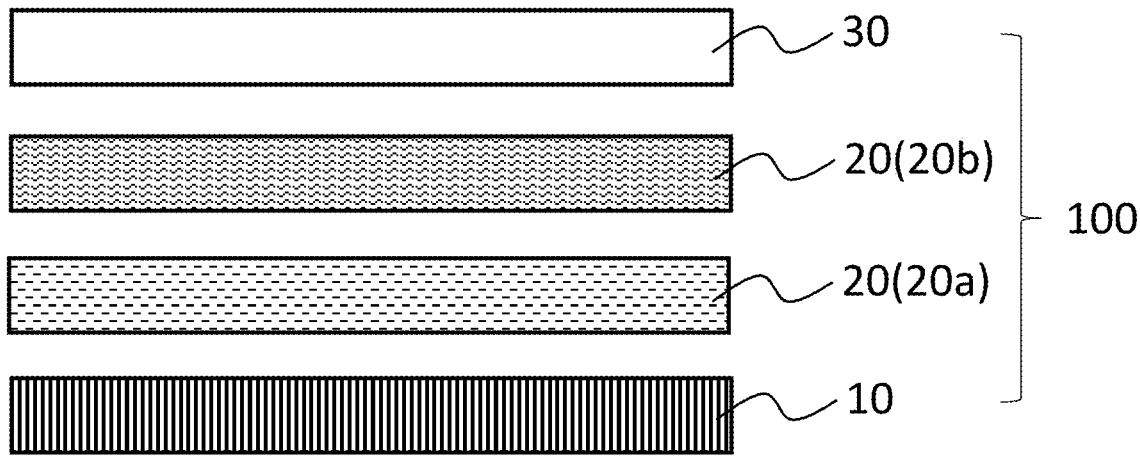
[Fig. 3]
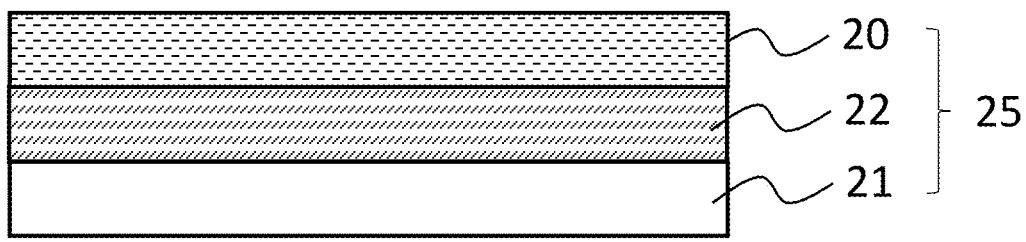

[Fig. 4]
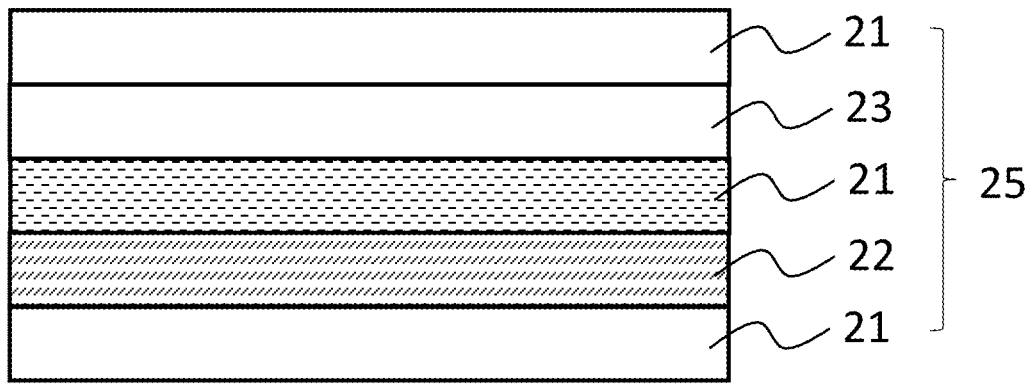
[Fig. 5]
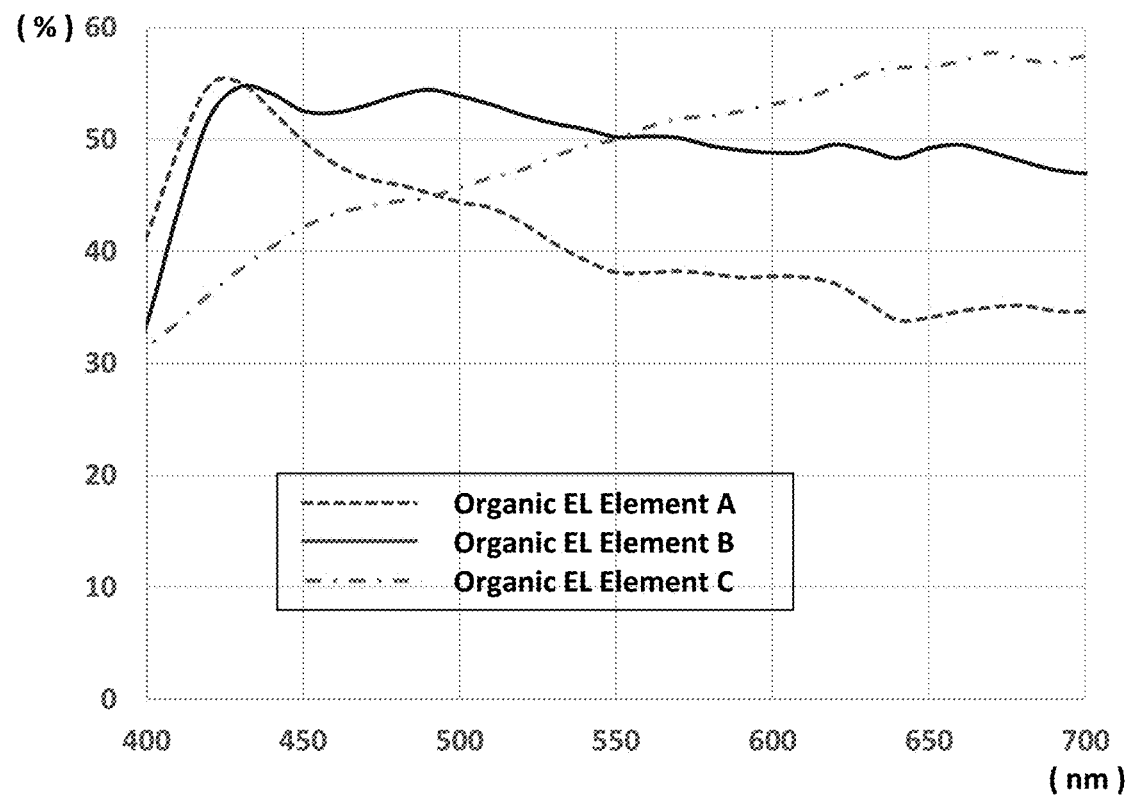

[Fig. 6]
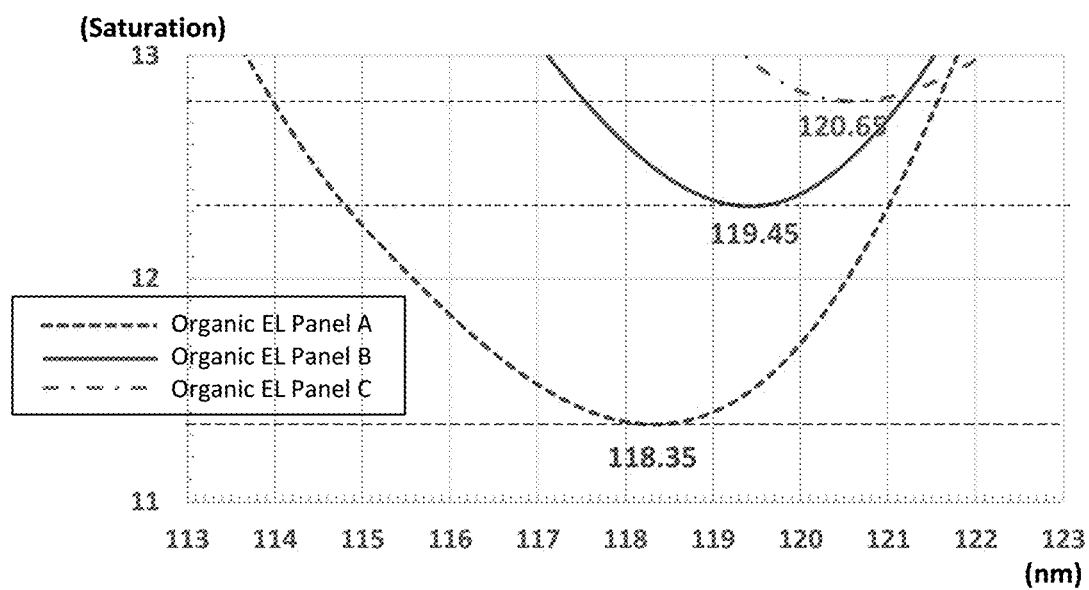
[Fig. 7]
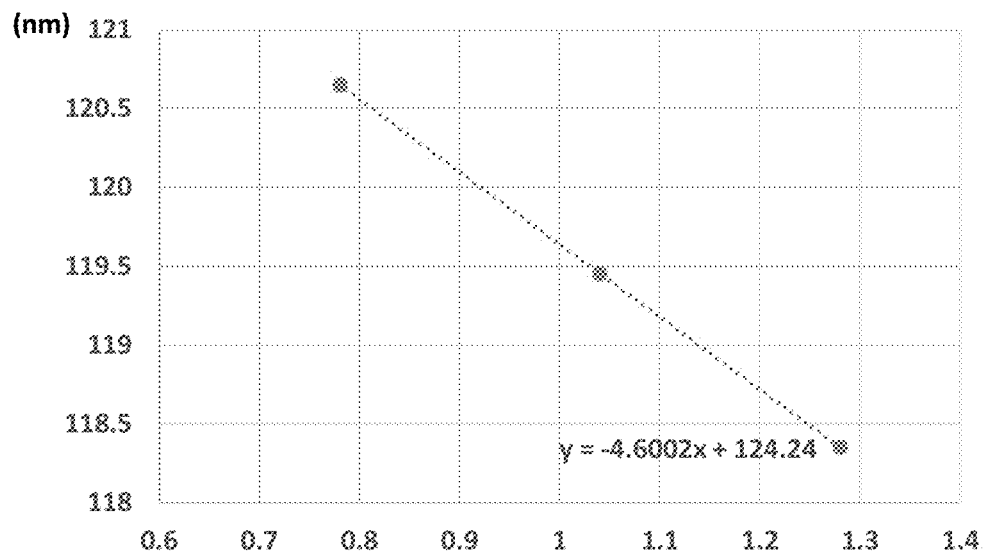

[Fig. 8]
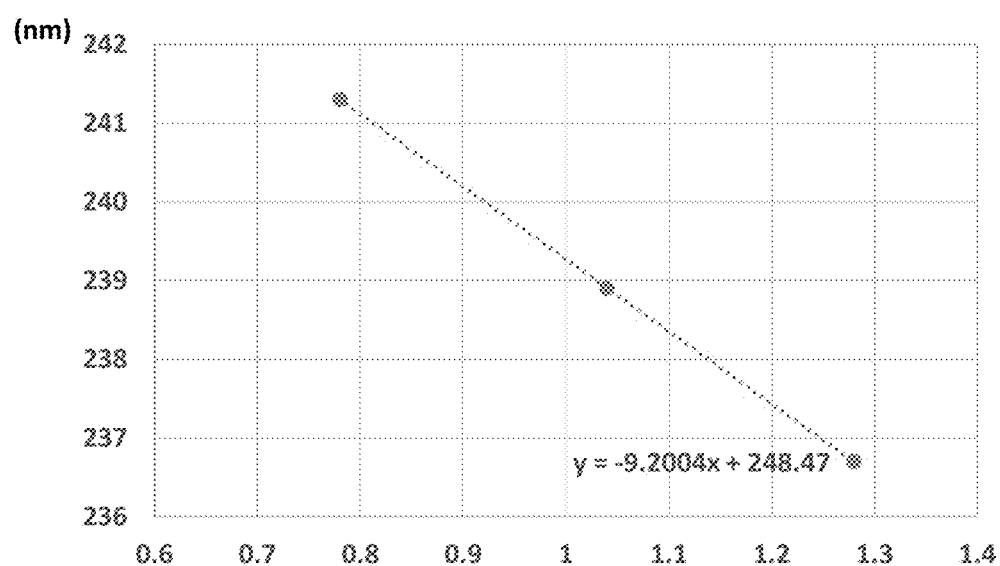

US 11,953,710 B2

DISPLAY PANEL, DISPLAY DEVICE, AND METHOD FOR SORTING PHASE DIFFERENCE LAYER OF DISPLAY PANEL

TECHNICAL FIELD

The present invention relates to a display panel, a display device, and a method of selecting a retardation layer of display panel.

BACKGROUND ART

An electroluminescent display element (hereinafter, electroluminescent display element may be abbreviated as "EL Element" in some cases) having a wide viewing area due to self-light emission, and consuming less power than a plasma light emitting element or the like, and thus, its applicability to an image display device has recently been put into practical use. In particular, organic EL Elements using an organic compound as a light emitting material can significantly reduce applied voltage as compared to inorganic EL Elements using an inorganic compound, and thus, its use in display devices in various ways has been examined.

An organic EL Element is generally known to have a structure in which a first electrode, a light emitting layer, and a second electrode are sequentially stacked on a transparent substrate. The organic EL Element includes a bottom emission type in which a transparent electrode is used as the first electrode, a metal electrode is used as the second electrode, and light emitted from the light emitting layer is obtained through the transparent substrate side; and a top emission type in which a metal electrode is used as the first electrode, a transparent electrode is used as the second electrode, and light emitted from the light emitting layer is obtained through the second electrode side (e.g., PTLs 1 and 2).

In many cases, for any type of organic EL Element, a metal electrode with excellent reflectivity is applied in order to use the light of the light emitting layer efficiently. Meanwhile, the magnitude of external light reflection from an organic EL Element using such a metal electrode is large, and contrast deteriorates in some cases. Also, even in display devices (for example, display devices including a micro-LED element, and display devices in which a resistive film type touch panel is arranged on a display element) other than display devices including an organic EL Element, deterioration in contrast caused by external light reflection has been a problem.

Various methods of suppressing external light reflection in a display device have been examined. As one of these methods, a method using a so-called circular polarizing plate in which a retardation plate and a polarizing plate are stacked is known (for example, PTL 3).

CITATION LIST

Patent Literature

PTL 1: JP 2007-294421 A
PTL 2: JP 2007-80604 A
PTL 3: JP 2015-57666 A

SUMMARY OF THE INVENTION

Technical Problem

However, when a circular polarizing plate such as was used in PTL 3 was incorporated into a display device in which the magnitude of external light reflection is large, deterioration of the color tone of the display device has occasionally been observed.

Solution of the Problem

As a result of intensive studies, the present inventors have found that, in display devices from which the magnitude of external light reflection is large, spectral distributions of reflected light differ dependent upon the difference in the composition of display elements (for example, the differences in metal composition among metal electrodes constituting the display elements). Consequently, as a result of further intensive studies, the present inventors have found that it is possible to suppress deterioration of color tone of a display panel and a display device by inclusion of an appropriate retardation layer corresponding to the spectral distribution of reflected light of the display element and have thus completed the present invention.

That is to say, the present invention provides the following [1] to [3]:

[1] A display panel including a display element (A), a retardation layer (B) positioned upon the light emission surface side of the display element, and a polarizer (C) positioned upon the light emission surface side of the retardation layer, wherein the retardation layer (B) includes a $\lambda/4$ retardation layer (B1), and the in-plane retardation of the $\lambda/4$ retardation layer (B1) satisfies the following Condition 1:

<Condition 1>

The spectral reflectance of the display element is measured by an SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the $\lambda/4$ retardation layer falls within the range of $-4.6002x+119.24$ nm or more and $-4.6002x+129.24$ nm or less.

[2] A display device including the display panel described in [1] above.

[3] A method of selecting a retardation layer of a display panel, for a display panel including a display element (A), a retardation layer (B) positioned upon the light emission surface side of the display element, and a polarizer (C) positioned upon the light emission surface side of the retardation layer, wherein the retardation layer (B) includes a $\lambda/4$ retardation layer (B1), the said method including selecting a $\lambda/4$ retardation layer satisfying the following Condition 1 as the $\lambda/4$ retardation layer (B1):

<Condition 1>

The spectral reflectance of the display element is measured by an SCI method, the average reflectance at wavelengths over the range of 400 nm or more and less than 550 nm is obtained as $R_1$, and the average reflectance at wavelengths over the range of 550 nm or more and less than 700 nm is obtained as $R_2$, and when the value of $R_1/R_2$ is calculated and obtained as x, the in-plane retardation of the $\lambda/4$ retardation layer falls within the range of $-4.6002x+119.24$ nm or more and $-4.6002x+129.24$ nm or less.

Advantageous Effects of the Invention

In the display panel and the display device of the present invention, deterioration of the color tone of the display panel and the display device caused by external light reflection can be suppressed. Moreover, by the method of selecting the retardation layer of the display panel of the present invention, it is possible to properly select a retardation layer that suppresses deterioration of the color tone of the display panel, and thus the product design of the display panel can be made efficient.

BRIEF DESCRIPTION OF DRAWINGS

FIG. 1 is a sectional view illustrating an embodiment of the display panel of the present invention.

FIG. 2 is a sectional view illustrating another embodiment of the display panel of the present invention.

FIG. 3 is a sectional view illustrating an embodiment of a laminate including a retardation layer positioned upon the display panel of the present invention.

FIG. 4 is a sectional view illustrating another embodiment of the laminate including the retardation layer positioned upon the display panel of the present invention.

FIG. 5 is a view illustrating spectral reflectances of commercially available organic EL display elements A to C.

FIG. 6 is a view illustrating the relationship between the saturation based on reflected light (y axis) and the in-plane retardation of the retardation layer (x axis) in display panels in which retardation layers and polarizers are stacked on the commercially available organic EL display elements A to C.

FIG. 7 is a view illustrating an approximate straight line as a reference for Condition 1.

FIG. 8 is a view illustrating an approximate straight line as a reference for Condition 2.

DESCRIPTION OF EMBODIMENTS

The embodiments of the present invention will be described hereinafter.

[Display Panel]

The display panel of the present invention includes a display element (A), a retardation layer (B) positioned upon the light emission surface side of the display element, and a polarizer (C) positioned upon the light emission surface side of the retardation layer. The retardation layer (B) includes a λ/4 retardation layer (B1), and the in-plane retardation of the λ/4 retardation layer (B1) satisfies the following Condition 1:

<Condition 1>

The spectral reflectance of the display element is measured by an SCI method, the average reflectance at wavelengths over the range 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/4 retardation layer falls within the range of −4.6002x+119.24 nm or more and −4.6002x+129.24 nm or less.

<<Condition 1>>

With respect to the display panel of the present invention, the spectral reflectance of the display element is measured by an SCI method, the average reflectance at wavelengths over the range of 400 nm or more and less than 550 nm is obtained as $R_1$ and the average reflectance at wavelengths over the range of 550 nm or more and less than 700 nm is obtained as $R_2$. When the value of $R_1/R_2$ is calculated and obtained as x, the display panel of the present invention is characterized in that the in-plane retardation of the λ/4 retardation layer falls within the range of −4.6002x+119.24 nm or more and −4.6002x+129.24 nm or less.

The technical concept of Condition 1 will be described hereinbelow.

FIG. 5 is a view illustrating the results when the spectral reflectances of organic EL Elements A to C included in three different types of commercially available organic EL display panels were measured by an SCI method. From FIG. 5, it can be observed that the spectral reflectances of the organic EL Elements at each wavelength vary depending on the types of the organic EL display panels. Also, from FIG. 5, it can be understood that the difference between display elements in terms of the reflectances at each wavelength may affect the color tone of a display panel or a display device.

With respect to the organic EL Elements A to C of FIG. 5, when $R_1$ is the average reflectance at wavelengths over the range of 400 nm or more and less than 550 nm, and $R_2$ is the average reflectance at wavelengths over the range of 550 nm or more and less than 700 nm, $R_1/R_2$ is calculated as 1.28 for the organic EL Element A, 1.04 for the organic EL Element B, and 0.78 for the organic EL Element C.

The human eye possesses great sensitivity near the wavelength of 550 nm. Therefore, it can be said that $R_1/R_2$ indicates whether the spectrum of light reflected from a display element is biased to the blue side or the red side with respect to 550 nm, a boundary at which the sensitivity of the human eye is high.

FIG. 6 is a view of the in-plane retardation of a λ/4 retardation layer as the x axis, and saturation as the y axis when spectral reflectances of organic EL display panels A to C obtained by stacking λ/4 retardation layers, λ/2 retardation layers and polarizers in this order upon the organic EL Elements A to C in FIG. 5 were measured by an SCI method, and "saturation" was calculated from the reflected light measured. Although not illustrated, the in-plane retardation of the λ/2 retardation layer used in the measurement in FIG. 6 is twice the in-plane retardation of the λ/4 retardation layer. Also, in the measurement in FIG. 6, the angle formed by the absorption axis of the polarizer and the orientation axis of the λ/4 retardation layer is +75°, and the angle formed by the absorption axis of the polarizer and the orientation axis of the λ/2 retardation layer is +15°. Moreover, the graph of FIG. 6 is smoothed by Excel (registered trademark) 2013 of Microsoft corporation.

The saturation is the value obtained by the following equation, on the basis of a* and b* in a Lab color system:

$$\text{Saturation} = [(a^*)^2 + (b^*)^2]^{1/2}$$

From FIG. 6, when the saturation attains a minimum value, the in-plane retardation of the λ/4 retardation layer can be read as 118.35 nm for the organic EL display panel A, 119.45 nm for the organic EL display panel B, and 120.65 nm for the organic EL display panel C.

Moreover, although not illustrated, the in-plane retardation of the λ/2 retardation layer can be read as 236.7 nm for the organic EL display panel A, 238.9 nm for the organic EL display panel B, and 241.3 nm for the organic EL display panel C when the saturation attains a minimum value.

FIG. 7 is a view illustrating a scatter diagram in which $R_1/R_2$ is set as the x axis, and the in-plane retardation of the λ/4 retardation layer when saturation attains a minimum value as read from FIG. 6 is set as the y axis, and an approximate straight line determined by the least squares method is drawn.

FIG. 8 is a view illustrating a scatter diagram in which $R_1/R_2$ is set as the x axis and the in-plane retardation of the λ/2 retardation layer when saturation attains a minimum value is set as the y axis, and an approximate straight line determined by the least squares method is drawn.

From FIG. 7 and FIG. 8, it can be observed that $R_1/R_2$, and the in-plane retardation of the λ/4 retardation layer and the λ/2 retardation layer for which the saturation of the display panel has attained a minimum value possess a proportional relationship. That is to say, when the value of $R_1/R_2$ of the display element is obtained, it is possible to know the in-plane retardation of the λ/4 retardation layer and the λ/2 retardation layer proper for suppressing deterioration of color tone by reducing the saturation of the reflected light of the display panel, based on the approximate straight lines in FIG. 7 and FIG. 8.

Under Condition 1, the in-plane retardation calculated from the approximate straight line of FIG. 7 is evaluated as an optimum in-plane retardation of the λ/4 retardation layer for suppressing deterioration of the color tone of the reflected light, and a range of ±5 nm centered on the optimum value is defined as an allowable range.

When Condition 1 is not satisfied (in a case where the in-plane retardation of the λ/4 retardation layer is less than −4.6002x+119.24 nm, or greater than −4.6002x+129.24 nm when the value of $R_1/R_2$ is x), deterioration of the color tone of the reflected light of the display panel cannot be suppressed.

Under Condition 1, the in-plane retardation of the λ/4 retardation layer is preferably −4.6002x+121.24 nm or more and −4.6002x+127.24 nm or less, and more preferably −4.6002x+123.24 nm or more and −4.6002x+125.24 nm or less.

According to the present specification, the in-plane retardation under Condition 1 and Condition 2 to be described below means the in-plane retardation at a wavelength of 550 nm. Moreover, the in-plane retardation is expressed by the following equation in which $n_x$ is the refractive index in the slow axis direction, the direction in which the refractive index is largest in the plane of the retardation layer, and in which $n_y$ is the refractive index in the fast axis direction which is the direction orthogonal to the slow axis direction in the plane of the retardation layer, and in which d (nm) is the thickness of the retardation layer:

$$\text{In-plane retardation(Re)}=(n_x-n_y)\times d$$

Also, it is preferable that, in the display panel of the present invention, the retardation layer (B) includes the λ/2 retardation layer (B2).

When the retardation layer (B) includes the λ/2 retardation layer (B2) in addition to the λ/4 retardation layer (B1), it is possible to easily suppress the reflection of the display panel over a wide wavelength range.

Furthermore, in the display panel of the present invention, it is preferable that the in-plane retardation of the λ/2 retardation layer (B2) satisfies the following Condition 2:
<Condition 2>

The spectral reflectance of the display element is measured by an SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/2 retardation layer falls within the range of −9.2004x+238.47 nm or more and −9.2004x+258.47 nm or less.

Under Condition 2, the in-plane retardation calculated from the approximate straight line of FIG. 8 is evaluated as the optimum in-plane retardation of the λ/2 retardation layer for suppressing deterioration of the color tone of the reflected light, and a range of ±10 nm centered on the optimum value is defined as an allowable range. When Condition 2 is satisfied, deterioration of the color tone of the reflected light of the display panel can be further suppressed.

Under Condition 2, the in-plane retardation of the λ/2 retardation layer is preferably −9.2004x+242.47 nm or more and −9.2004x+254.47 nm or less, and more preferably −9.2004x+246.47 nm or more and −9.2004x+250.47 nm or less.

In the present specification, the reflectance under the SCI method refers to total light reflectance. SCI renders a reflectance calculated from values obtained by measuring all reflected light in all directions including in the specular reflection direction, after light is applied to a sample surface, by using an integrating sphere and a light trap has been closed. A typical SCI measurement device has a configuration conforming to geometric condition c of JIS Z8722: 2009. More specifically, in a typical SCI and SCE measurement device, the position of the light receiver is +8 degrees with respect to the normal of the sample plane, the opening angle of the light receiver is 10 degrees, the position of the light trap is −8 degrees with respect to the normal of the sample plane, and the coverage of the light trap is 10 degrees. Examples of such a measurement device include CM-2002 (product name) manufactured by Konica Minolta Co, Ltd.

It is preferable to measure the spectral reflectance using the SCI method at every 1 nm, but when the measurement wavelength interval of the measurement device exceeds 1 nm, it is preferable to calculate $R_1/R_2$ on the assumption that the absolute values of change amounts of the reflectance at every 1 nm are uniform within the measurement interval.

Also, according to the present specification, the spectral reflectance of the display element, $R_1/R_2$, and the saturation of the display panel refer to average values of measurement values taken at 16 positions. As to the 16 measurement positions, when a region 1 cm from the outer edge of a measurement sample is set as the margin, and lines that equally divide a region inside the margin in both the vertical direction and the horizontal direction into 5 parts are drawn, it is preferable that 16 positions at intersecting points are set as centers of measurement. In the case where a measurement sample is a quadrangle, it is preferable that a region 1 cm from the outer edge of the quadrangle is set as the margin, and that measurement then be performed with a central focus on 16 positions at the intersecting points of the lines equally dividing the region inside the margin into 5 parts in the vertical direction and 5 parts in the horizontal direction, and from these the average value is calculated. In a case of a measurement sample having a shape other than a quadrangle, such as a circle, an ellipse, a triangle, or a pentagon, it is preferable that a quadrangle inscribed within these shapes with maximum-area be drawn, and measurement in regard to this quadrangle be carried out on 16 positions by the above-mentioned method.

FIG. 1 and FIG. 2 are sectional views illustrating embodiments of display panel 100 of the present invention.

As illustrated in FIG. 1 and FIG. 2, the display panel 100 of the present invention includes a display element (A) 10, a retardation layer (B) 20 positioned upon the light emission surface side of the display element, and a polarizer (C) 30 positioned on the light emission surface side of the retardation layer (B) 20.

Also, each of the display panels 100 in FIG. 1 and FIG. 2 includes a λ/4 retardation layer 20a as the retardation layer 20, and the display panel 100 of FIG. 2 further includes a λ/2 retardation layer 20b as the retardation layer 20.

<Display Element (A)>

Examples of the display element include an organic EL Element, an inorganic EL Element, a micro-LED element, a liquid crystal element, a plasma element and the like. The liquid crystal display element may be an in-cell touch panel liquid crystal display element in which a touch panel function is provided.

Among these display elements, the effect of the present invention is exerted effectively on the organic EL Element and the micro-LED element which have high reflectances and are likely to cause problem involving deterioration of the color tone due to external light reflection.

When the reflectances of the display element at wavelengths over the range of 400 nm or more and 700 nm or less are measured by SCI method, the average of reflectance at these wavelengths is preferably 35% or more, and more preferably 40% or more. Such a display element having a high reflectance is likely to experience problems involving deterioration of the color tone due to external light reflection; thus, the effects of the present invention are effectively exerted thereupon.

<Retardation Layer (B)>

The retardation layer (B) includes at least a λ/4 retardation layer (B1). Moreover, it is preferable that the retardation layer (B) further include a λ/2 retardation layer (B2).

Constituent materials of the λ/4 retardation layer (B1) and the λ/2 retardation layer (B2) are not particularly limited. The retardation layers (B1) and (B2) may each be a retardation layer formed of a composition containing a liquid crystal compound or a retardation layer obtained by orientation of a polymer film, or may include both of the layers.

The retardation layer made of a composition containing a liquid crystal compound is generally formed by applying a composition for forming the retardation layer on a transparent substrate, followed by drying, and if necessary, curing. Also, as illustrated in FIG. 3 and FIG. 4, it is preferable that an alignment film 22 be provided on the surface side of transparent substrate 21 on which retardation layer 20 is formed.

The λ/4 retardation layer (B1) is not particularly limited as long as Condition 1 is satisfied, but from the viewpoint of versatility, it is preferable that it exhibit positive dispersion.

The positive dispersion is a characteristic in which an in-plane retardation given to transmitted light is reduced as the wavelength becomes longer. Specifically, that is the characteristic in which the relationship between the in-plane retardation (Re450) at a wavelength of 450 nm and the in-plane retardation (Re550) at a wavelength of 550 nm is Re450>Re550. In contrast, negative dispersion is a characteristic in which Re450<Re550.

The in-plane retardation (Re550) of the λ/4 retardation layer is preferably 105 nm or more and 135 nm or less, more preferably 110 nm or more and 130 nm or less, and even more preferably 113 nm or more and 127 nm or less.

According to the present specification, an in-plane retardation (Re) and a thickness direction retardation ($R_{th}$) may be expressed by the following equation when $n_x$ is a refractive index in the slow axis direction in the plane, and $n_y$ is a refractive index in a direction orthogonal to $n_x$ in the plane, and $n_z$ is a refractive index in a direction orthogonal to $n_x$ and $n_y$, and the film thickness is d (nm):

In-plane retardation(Re)=$(n_x-n_y) \times d$

Thickness direction retardation($R_{th}$)=$((n_x+n_y)/2-n_z) \times d$

Also, in the λ/4 retardation layer, Re450/Re550 is preferably 1.13 or less, more preferably 1.10 or less, even more preferably 1.07 or less. When Re450/Re550 of the λ/4 retardation layer is set to be 1.13 or less, it is possible to more easily suppress deterioration of color tone. The lower limit of Re450/Re550 of the λ/4 retardation layer is not particularly limited but is generally 1.04 or more.

When only the λ/4 retardation layer (B1) is applied as the retardation layer (B), an angle formed by the orientation axis of the λ/4 retardation layer and the absorption axis of the polarizer is set to be preferably 45±5°, and more preferably 45±2°.

The λ/2 retardation layer (B2) is not particularly limited, but from the viewpoint of versatility, it is preferable that it have positive dispersion.

The in-plane retardation (Re550) of the λ/2 retardation layer is preferably 210 nm or more and 270 nm or less, more preferably 220 nm or more and 260 nm or less, and even more preferably 225 nm or more and 255 nm or less.

Also, in the λ/2 retardation layer, Re450/Re550 is preferably 1.13 or less, more preferably 1.10 or less, and even more preferably 1.07 or less. When Re450/Re550 of the λ/2 retardation layer is set to be 1.13 or less, it is possible to more easily suppress deterioration of color tone. The lower limit of Re450/Re550 of the λ/2 retardation layer is not particularly limited but is generally 1.04 or more.

When the λ/4 retardation layer (B1) and the λ/2 retardation layer (B2) are applied as the retardation layer (B), an angle formed by the orientation axis of each retardation layer and the absorption axis of the polarizer preferably falls within the following range (i) or (ii):

(i) As a first example, an angle formed by the slow axis of the λ/2 retardation layer and the absorption axis of the polarizer layer is preferably 15±8° and more preferably 15±6°. Therefore, in this case, an angle formed by the slow axis of the λ/4 retardation layer and the absorption axis of the polarizer layer is preferably 75±15° and more preferably 75±13°.

(ii) As a second example, an angle formed by the slow axis of the λ/2 retardation layer and the absorption axis of the polarizer layer is preferably 75±15° and more preferably 75±13°. Therefore, in this case, an angle formed by the slow axis of the λ/4 retardation layer and the absorption axis of the polarizer layer is preferably 15±8° and more preferably 15±6°.

<<Liquid Crystal Compound>>

The type of the liquid crystal compound usable for forming the retardation layer is not particularly limited. For example, a retardation layer obtained by forming a low-molecular weight liquid crystal compound with nematic alignment in a liquid crystal state, and then fixing the alignment through photo-crosslinking or thermal-crosslinking; or a retardation layer obtained by forming a high-molecular weight liquid crystal compound with nematic alignment in a liquid crystal state, and then fixing the alignment by cooling may be used. In the present invention, even in the case where a liquid crystal compound is adopted for use as the retardation layer, the retardation layer is a layer formed by fixation of the liquid crystal compound through polymerization or the like and does not need to exhibit liquid crystallinity once the layer has been formed. The polymerizable liquid crystal compound may be a polyfunctional polymerizable liquid crystal compound or a monofunctional polymerizable liquid crystal compound. Additionally, the liquid crystal compound may be a discotic liquid crystal compound or a rod-like liquid crystal compound.

In the retardation layer, it is preferable that the liquid crystal compound be fixed in an alignment state of vertical alignment, horizontal alignment, hybrid alignment, or oblique alignment. From the viewpoint of enabling the viewing angle dependency to be symmetric, it is preferable that the disc plane of the discotic liquid crystal compound be substantially perpendicular to the film plane (plane of the retardation layer), or that the major axis of the rod-like liquid crystal compound be substantially horizontal with respect to the film plane (plane of the retardation layer).

A discotic liquid crystal compound that is substantially perpendicular means that the average value of the angle formed by the film plane (plane of the retardation layer) and the disc plane of the discotic liquid crystal compound ranges from 70° or more and 90° or less. The range is preferably 80° or more and 90° or less, and more preferably 85° or more and 90° or less.

A rod-like liquid crystal compound that is substantially horizontal means one where the angle formed by the film plane (retardation plane) and the director of the rod-like liquid crystal compound ranges from 0° or more and 20° or less. This range is preferably 0° or more and 10° or less, and more preferably 0° or more and 5° or less.

The retardation layer containing a liquid crystal compound may be composed of only a single layer or a laminate of two or more layers.

The retardation layer containing a liquid crystal compound may be formed by coating a coating liquid that contains the liquid crystal compound such as a rod-like liquid crystal compound or a discotic liquid crystal compound on a transparent substrate, and if desired, a polymerization initiator, an orientation control agent, or other additives to be described below may be added. It is preferable to form the retardation layer by forming an alignment film on the transparent substrate, and the coating liquid is coated on the surface of the alignment film. The thickness of the retardation layer is preferably 10 μm or less, more preferably 7 μm or less, and even more preferably 5 μm or less. The lower limit of the thickness of the retardation layer is not particularly limited but is generally about 0.1 μm.

-Discotic Liquid Crystal Compound-

In the formation of the retardation layer of the present invention, it is preferable to adopt a discotic liquid crystal compound. The discotic liquid crystal compound is described in various places in the literature (e.g., C. Destrade et al., Mol. Crysr. Liq. Cryst., vol. 71, page 111(1981); The Chemical Society of Japan, Quarterly Chemistry Review, No. 22, Liquid Crystal Chemistry, Chapter 5, Chapter 10 Section 2 (1994); B. Kohne et al., Angew. Chem. Soc. Chem. Comm., page 1794 (1985); J. Zhang et al., J. Am. Chem. Soc., vol. 116, page 2655 (1994)). The polymerization of the discotic liquid crystal compound is described in JP 8-27284A.

It is preferable that the discotic liquid crystal compound have a polymerizable group so that fixation is possible through polymerization. For example, although a structure where a polymerizable group is bound as a substituent to a disc-shaped core of the discotic liquid crystal compound may be considered, when the polymerizable group is directly bound to the disc-shaped core, it becomes difficult to maintain the aligned state through the polymerization reaction. A structure with a linking group between the disc-shaped core and the polymerizable group is preferred. That is, the discotic liquid crystal compound having a polymerizable group is preferably a compound represented by the following formula:

D(-L-P)n

In the formula, D represents a disc-shaped core, L represents a divalent linking group, P represents a polymerizable group, and n is an integer of 1 to 12. Preferred specific examples of the disc-like core (D), the divalent linking group (L), and the polymerizable group (P) in the formula are (D1) to (D15), (L1) to (L25), and (P1) to (P18), respectively, as described in JP 2001-4837A, and contents described in the foregoing publication are preferably adopted. A transition temperature from a discotic nematic liquid crystal phase to a solid phase of the liquid crystal compound is preferably between 30° C. or more and 300° C. or less, and more preferably 30° C. or more and 170° C. or less.

-Rod-Like Liquid Crystal Compound-

As the liquid crystal compound that forms the retardation layer, a rod-shaped liquid crystal compound may be adopted. Preferred examples of the rod-like liquid crystal compound include azomethines, azoxys, cyanobiphenyls, cyanophenyl esters, benzoic acid esters, phenyl cyclohexanecarboxylate esters, cyanophenyl cyclohexanes, cyano-substituted phenyl pyrimidines, alkoxy-substituted phenyl pyrimidines, phenyl dioxanes, tolanes, and alkenylcyclohexylbenzonitriles. Not only the above-mentioned low-molecular weight liquid crystal compounds, but also high-molecular weight liquid crystal compounds may be adopted. It is preferable to fix the alignment of the rod-like liquid crystal compound through polymerization. The liquid crystal compound preferably has a substructure with components capable of reacting in a polymerization or crosslinking reaction initiated by actine rays, electron beams, heat or the like, and more preferably has a polymerizable group.

The number of the partial structures is preferably 1 or more and 6 or less, and more preferably 1 or more and 3 or less. Examples of the polymerizable rod-like liquid crystal compound include compounds described in Makromol. Chem., vol. 190, page 2255 (1989), Advanced Materials, vol. 5, page 107 (1993), specifications of U.S. Pat. Nos. 4,683,327, 5,622,648, and 5,770,107, WO 95/22586 A, WO 95/24455 A, WO 97/00600 A, WO 98/23580 A, WO 98/52905 A, JP 1-272551 A, JP 6-16616 A, JP 7-110469 A, JP 11-80081 A, JP 2001-328973A, and the like.

Specific examples of the rod-like liquid crystal compound include compounds represented by the following formulae (1) to (17):

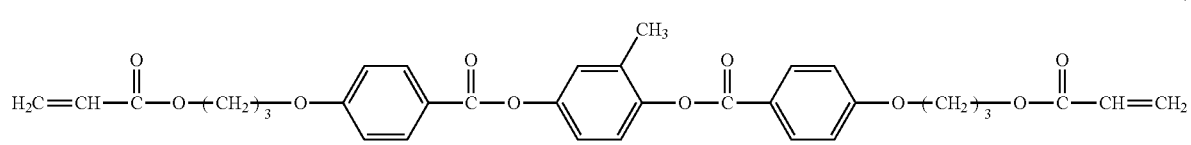

(1)

-continued
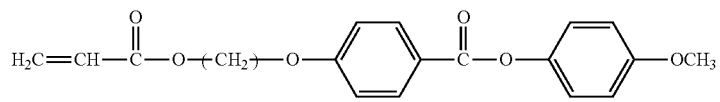
(2)
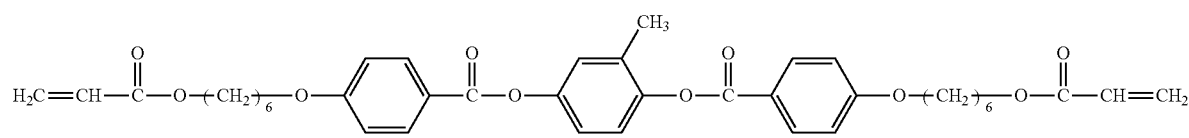
(3)
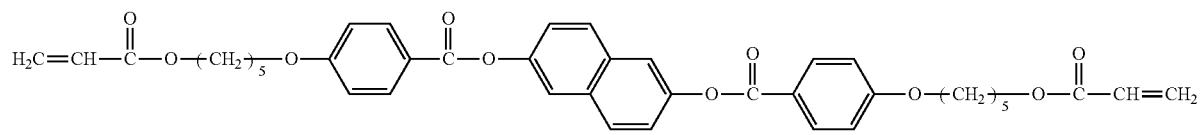
(4)
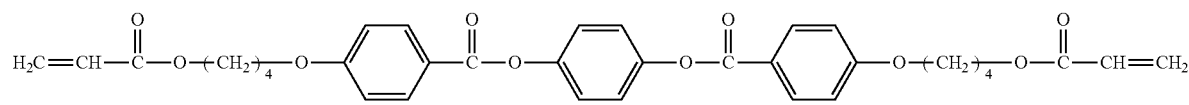
(5)
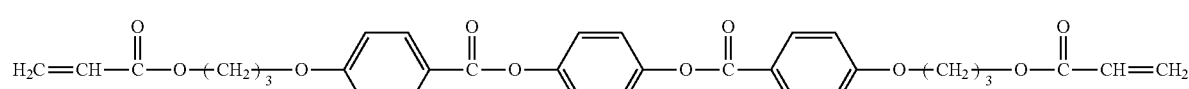
(6)
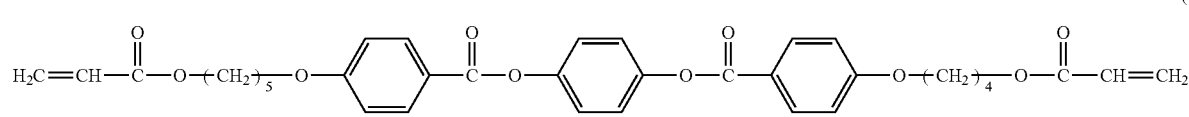
(7)
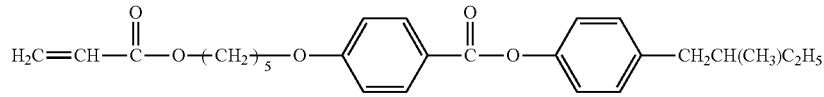
(8)
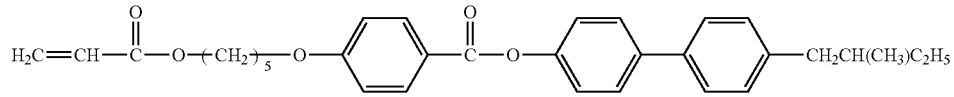
(9)
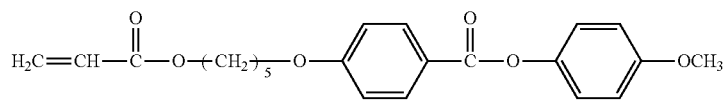
(10)
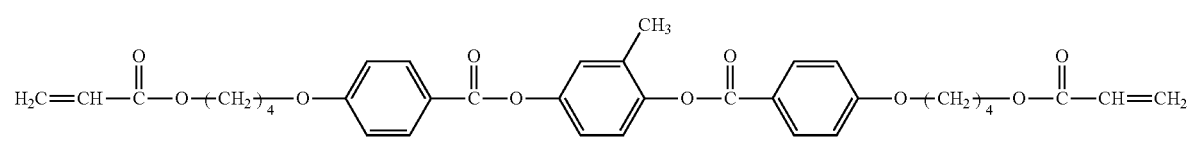
(11)
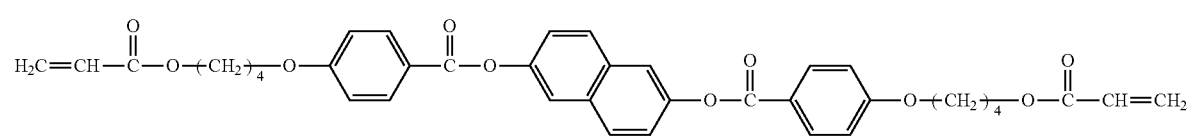
(12)
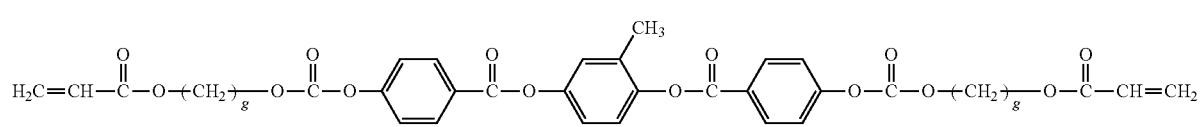
(13)

g represents an integer from 2 to 5.

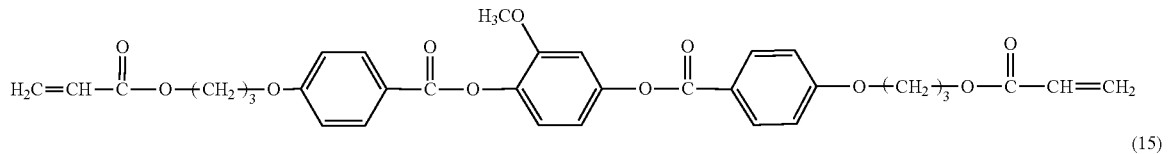

(14)

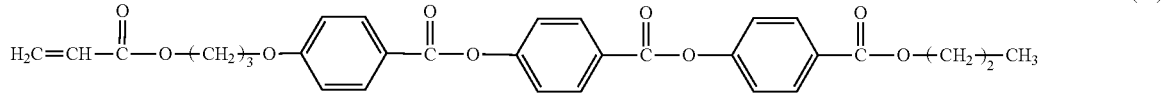

(15)

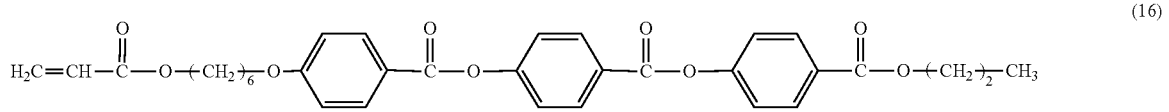

(16)

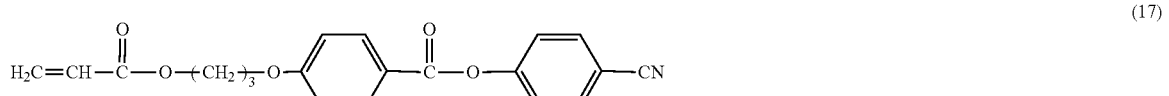

(17)

Moreover, examples of liquid crystal compounds exhibiting negative dispersion include compounds described in publications of unexamined applications such as JP 2010-537954 A, JP 2010-537955 A, JP 2010-522892 A, JP 2010-522893 A, and JP 2013-509458 A, and patent gazettes such as Japanese Patents Nos. 5892158, 5979136, 5994777, and 6015655.

A single kind of the liquid crystal compound may be used alone, or two or more kinds thereof may be used in combination. In the case of a single kind alone, this single kind of liquid crystal compound is preferably a polymerizable liquid crystal compound. In the case where two or more kinds are used in combination, it is preferable that at least one kind be a polymerizable liquid crystal compound, and it is more preferable that all of them be polymerizable liquid crystal compounds.

<<Polymerization Initiator>>

The aligned liquid crystal compound is fixed while the alignment state is maintained. For the fixation, it is preferable to use a polymerization reaction, and the polymerization reaction includes thermal polymerization reactions using thermal polymerization initiators and photopolymerization reactions using photopolymerization initiators. Among these, the photopolymerization reaction is preferred. Examples of the photopolymerization initiators include α-carbonyl compounds (see respective specifications of U.S. Pat. Nos. 2,367,661 and 2,367,670), acyloin ethers (see the specification of U.S. Pat. No. 2,448,828), α-hydrocarbon-substituted aromatic acyloin compounds (see the specification of U.S. Pat. No. 2,722,512), polynuclear quinone compounds (see respective specifications of U.S. Pat. Nos. 3,046,127 and 2,951,758), combinations of triaryl imidazole dimers and p-aminophenyl ketones (see the specification of U.S. Pat. No. 3,549,367), acridine and phenazine compounds (see specifications of JP 60-105667 A, and U.S. Pat. No. 4,239,850), and oxadiazole compounds (see the specification of U.S. Pat. No. 4,212,970).

The usage amount of the polymerization initiator is preferably 0.01 mass % or more and 20 mass % or less, more preferably 0.5 mass % or more and 5 mass % or less with respect to the total solid content of the composition for forming the retardation layer. In light irradiation for polymerization of the liquid crystal compound, the use of UV light is preferred. The irradiation energy is preferably 20 mJ/cm$^2$ or more and 50 J/cm$^2$ or less, more preferably 100 mJ/cm$^2$ or more and 800 mJ/cm$^2$ or less. In order to promote the photopolymerization reaction, the light irradiation may be carried out at elevated temperatures.

<<Surfactants>>

It is preferable that the composition for forming the retardation layer contain a surfactant. Also, among surfactants, it is preferable to select and use at least one kind selected from a fluorine-based surfactant having a polymerizable group and a silicon-based surfactant having a polymerizable group.

The content of the surfactant is preferably 0.01 mass % or more and 2.0 mass % or less, more preferably 0.1 mass % or more and 1.0 mass % or less with respect to the total solid content of the composition for forming the retardation layer.

<<Solvent>>

The composition for forming the retardation layer generally contains a solvent.

Examples of the solvents that may be used include ketones (e.g., acetone, methyl ethyl ketone, methyl isobutyl ketone, cyclopentanone, cyclohexanone, N-methyl-2-pyrrolidone), ethers (e.g., dioxane, tetrahydrofuran), aliphatic hydrocarbons (e.g., hexane), alicyclic hydrocarbons (e.g., cyclohexane), aromatic hydrocarbons (e.g., toluene, xylene), halocarbons (e.g., dichloromethane, dichloroethane), esters (e.g., methyl acetate, ethyl acetate, butyl acetate), alcohols (e.g., butanol, cyclohexanol), cellosolves (e.g., methyl cellosolve, ethyl cellosolve), cellosolve acetates, sulfoxides (e.g., dimethyl sulfoxide), and amides (e.g., dimethyl formamide, dimethyl acetamide), and mixtures of the foregoing.

<<Other Additives>>

In the present invention, the composition for forming the retardation layer may contain a plasticizer and a polymerizable monomer, and the like in addition to the above-mentioned components. It is preferable that such a component have compatibility with the liquid crystal compound, and do not inhibit alignment.

Examples of the polymerizable monomer include a radically polymerizable or cationically polymerizable compound, and a polyfunctional radically polymerizable monomer is preferred. A compound co-polymerizable with the above-mentioned liquid crystal compound containing a polymerizable group is preferred. Examples thereof include compounds described in paragraphs 0018 to 0020 of JP 2002-296423 A. The amount of the polymerizable compound to be added is preferably 1 mass parts or more and 50 mass parts or less, more preferably 5 mass parts or more and 30 mass parts or less with respect to 100 parts by mass of the liquid crystal compound.

<<Coating Method of the Retardation Layer>>

Coating of the composition for forming the retardation layer can be carried out by a conventionally known method (for example, a wire bar coating method, an extrusion coating method, a direct gravure coating method, a reverse gravure coating method, or a die coating method).

<<Transparent Substrate>>

The transparent substrate functions as a support for the retardation layer or has the function of protecting the retardation layer.

An optically isotropic transparent substrate is preferred. The transparent substrate may be formed of a polymer or may be formed of glass.

Examples of the polymer include cellulose acylate, polycarbonate-based polymers, polyester-based polymers such as polyethylene terephthalate or polyethylene naphthalate, acrylic-based polymers such as polymethylmethacrylate, and styrene-based polymers such as polystyrene or acrylonitrile styrene copolymer (AS resin). Furthermore, examples thereof also include polyolefins such as polyethylene and polypropylene, polyolefin-based polymers such as ethylene-propylene copolymer, vinyl chloride-based polymers, amide-based polymers such as nylon or aromatic polyamide, imide-based polymers, sulfone-based polymers, polyethersulfone-based polymers, polyetherether ketone-based polymers, polyphenylene sulfide-based polymers, vinylidene chloride-based polymers, vinyl alcohol-based polymers, vinyl butyral-based polymers, arylate-based polymers, polyoxymethylene-based polymers, epoxy-based polymers, or mixtures of these polymers.

The thickness of the transparent substrate is generally about 25 μm or more and 125 μm or less in the case of transparent substrates formed of polymer and is generally about 100 μm or more and 5 mm or less in the case of transparent substrates formed of glass.

<Alignment Film>

The alignment film has the role of allowing a compound (for example, a liquid crystal compound) included in the retardation layer to be easily aligned when the retardation layer-forming composition is coated, dried, and cured to form the retardation layer.

A display panel without an alignment film can be provided, even though the alignment film is included when the retardation layer is formed, if the retardation layer transfers to another member and the alignment film is prevented from being transferred to another member during the transfer.

The alignment film may be formed into an alignment layer by, for example, coating an alignment layer-forming composition on the transparent substrate and imparting an alignment regulating force thereto. The composition to be used for forming such an alignment film may be appropriately selected from conventionally known materials such as photo-dimerization-type materials.

The means for imparting the alignment regulating force to the alignment film may be conventionally known methods, and examples thereof include rubbing methods, photo-alignment methods, and shaping methods.

The thickness of the alignment film is generally 1 nm or more and 1000 nm or less, preferably 60 nm or more and 300 nm or less.

<Polarizer (C)>

As for the polarizer, any of an iodine-based polarizer, a dye-based polarizer using a dichroic dye, or a polyene-based polarizer may be adopted. The iodine-based polarizer and the dye-based polarizer can be produced conventionally using a polyvinylalcohol-based film. The absorption axis of the polarizer corresponds to the orienting direction of the film. Therefore, the polarizer oriented in the vertical direction (transport direction) has an absorption axis parallel to the longitudinal direction, and the polarizer oriented in the horizontal direction (direction perpendicular to transport direction) has an absorption axis perpendicular to the longitudinal direction.

It is preferable to have protective layers on both surfaces of the polarizer.

As for the protective layer, the same layers as those exemplified as the transparent substrate for the retardation layer can be adopted. Also, protective layers that are optically anisotropic are preferred. The protective layer for the polarizer on the display element side may be replaced with the surface substrate of the display element.

<Other Layers, Other Members>

The display panel of the present invention may further include other layers and other members.

For example, the members in the display panels in FIG. 1 and FIG. 2 may be bonded to each other by means of an adhesive layer. Moreover, the display panel may have functional layers such as a hard coat layer, an antiglare layer and an antireflection layer.

Also, the display panel of the present invention may include a touch panel between the display element (A) and retardation layer (B). Examples of touch panels include a resistive film type touch panel, a capacitance type touch panel, an optical type touch panel, an ultrasonic type touch panel, and an electromagnetic induction-type touch panel. These touch panels may be provided with a pressure detection function.

[Display Device]

Although the display device of the present invention is not particularly limited as long as it includes the display panel of the present invention, it is preferable that it include the display panel of the present invention, a drive controller electrically connected to the display panel, and a casing accommodating the foregoing.

[Method of Selecting the Retardation Layer of the Display Panel]

The method of selection of the retardation layer of the display panel of the present invention selects a λ/4 retardation layer satisfying the following Condition 1 as the λ/4 retardation layer (B1) in the display panel (which includes a display element (A), a retardation layer (B) positioned upon the light emission surface side of the display element, and a polarizer (C) positioned upon the light emission surface side of the retardation layer and in which the retardation layer (B) includes a λ/4 retardation layer (B1)):

<Condition 1>

The spectral reflectance of the display element is measured by an SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/4 retardation layer falls within the range of −4.6002x+119.24 nm or more and −4.6002x+129.24 nm or less.

According to the method of selecting the retardation layer of the display panel of the present invention, it is possible to properly select a retardation layer by which deterioration of the color tone of the display panel is suppressed, and thus the product design of the display panel can be made efficient.

Moreover, according to the method of selecting the retardation layer of the display panel of the present invention, it is preferable to select a λ/2 retardation layer satisfying the following Condition 2 as the λ/2 retardation layer (B2) when the retardation layer (B) further includes a λ/2 retardation layer (B2):

<Condition 2>

The spectral reflectance of the display element is measured by an SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/2 retardation layer falls within the range of −9.2004x+238.47 nm or more and −9.2004x+258.47 nm or less.

By selecting a retardation layer satisfying Condition 2, it is possible to design efficiently a display panel with more improved quality.

EXAMPLES

Next, the present invention will be described in more detail with reference to Examples, but the present invention is not at all limited by these examples. "Part" and "%" are based on mass unless otherwise specified.

1. Reflectances of Display Elements A to C

Three types of commercially available organic EL display devices were obtained, and organic EL display elements were taken out of these organic EL display devices. The three extracted organic EL display elements were denoted as organic EL Elements A to C, and spectral reflectances of the organic EL Elements A to C were measured with an SCI method using a spectral colorimeter (manufactured by Konica Minolta Co, Ltd., product name: CM-2600d, measurement wavelength interval: 10 nm).

On the assumption that the absolute values of the amount of change of reflectance at every 1 nm are uniform within the measurement wavelength interval (10 nm), the reflectances were calculated at every 1 nm, and $R_1/R_2$ and the average of spectral reflectances over the range of 400 to 700 nm for the organic EL Elements A to C were also calculated. The calculated $R_1/R_2$ are illustrated in Tables 1 to 3. Additionally, the reflectances of every 1 nm as to the organic EL Elements A to C are illustrated in FIG. 5. The graph of FIG. 5 is smoothed by Excel (registered trademark) 2013 software of Microsoft corporation.

2. Saturation of Display Panels A to C

Spectral reflectances were measured with an SCI method by using a spectral colorimeter (manufactured by Konica Minolta Co, Ltd., product name: CM-2600d, measurement wavelength interval: 10 nm) for organic EL display panels A to C obtained by arranging λ/4 retardation layers, λ/2 retardation layers and polarizing plates including polarizers in this order on organic EL Elements A to C, and "saturation" was calculated from the reflected light measured. As for the λ/4 retardation layer and the λ/2 retardation layer, those having various retardation values were used as recorded in Tables 1 to 3. A general-purpose polarizing plate (the polarizer protective film used was an optically isotropic TAC film) including an iodine-based polarizer was used as the polarizing plate. Moreover, the polarizer and the retardation layers were arranged so that the angle formed by the absorption axis of the polarizer and the orientation axis of the λ/4 retardation layer was +75°, and the angle formed by the absorption axis of the polarizer and the orientation axis of the λ/2 retardation layer was +15°.

A smoothed graph was prepared (FIG. 6) in which the x axis is the in-plane retardation of the λ/4 retardation layer and the y axis is the saturation, and the in-plane retardation of the λ/4 retardation layer at which saturation attains the minimum value was observed to be 118.35 nm for organic EL display panel A, 119.45 nm for organic EL display panel B, and 120.65 nm for organic EL display panel C. The graph in FIG. 6 was smoothed by Excel (registered trademark) 2013 software of Microsoft corporation.

Also, a smoothed graph was prepared (the illustration is omitted) in which the x axis is the in-plane retardation of the λ/2 retardation layer and the y axis is the saturation, and the in-plane retardation of the λ/2 retardation layer at which the saturation attains the minimum value was observed to be 236.7 nm for organic EL display panel A, 238.9 nm for organic EL display panel B, and 241.3 nm for organic EL display panel C.

3. Calculation of the Criteria of Condition 1 and Condition 2

FIG. 7 is a view illustrating a scatter diagram in which $R_1/R_2$ is set as the x axis, and the in-plane retardation of the λ/4 retardation layer when saturation attains the minimum value observed in FIG. 6 is set as the y axis, and an approximate straight line is determined by the least squares method. From FIG. 7, it was observed that $R_1/R_2$ and the in-plane retardation of the λ/4 retardation layer at which the saturation of the display panel attains the minimum value have a proportional relationship. This proportional relationship may be expressed by the following equation (1) in which x represents $R_1/R_2$ and y represents the in-plane retardation:

$$y = -4.6002x + 124.24 \quad (1)$$

Moreover, FIG. 8 is a view illustrating a scatter diagram in which $R_1/R_2$ is set as the x axis and the in-plane retardation of the λ/2 retardation layer when saturation attains the minimum value is set as the y axis, and an approximate straight line is determined by the least squares method. From FIG. 8, it was observed that $R_1/R_2$ and the in-plane retardation of the λ/2 retardation layer at which the saturation of the display panel attains the minimum value have a proportional relationship. This proportional relationship may be expressed by the following equation (2) in which x represents $R_1/R_2$ and y represents the in-plane retardation:

$$y = -9.2004x + 248.47 \quad (2)$$

4. Evaluation

The display panels A to C in which display elements and retardation layers were combined as shown in Tables 1 to 3 were prepared, and the color tone of a screen was visually evaluated in a state where the panel was not lit up under the illumination of a fluorescent lamp. Evaluation was performed by 20 subjects according to the following criteria:

A: 15 or more people reported that the color tone of the screen was good

B: 10 or more and 14 or less people reported that the color tone of the screen was good C: 9 or fewer people reported that the color tone of the screen was good

TABLE 1

| | | | Experimental Example | | | | | | | | | | |
|---|---|---|---|---|---|---|---|---|---|---|---|---|---|
| | | | 1-1 | 1-2 | 1-3 | 1-4 | 1-5 | 1-6 | 1-7 | 1-8 | 1-9 | 1-10 | 1-11 |
| Display Panel A | Display Element A | $R_1/R_2$ | | | | | | 1.28 | | | | | |
| | | Average Spectral Reflectance (%) | | | | | | 41.3 | | | | | |
| | $\lambda/4$ Retardation Layer | In-Plane Retardation (nm) | 150 | 145 | 140 | 135 | 130 | 125 | 120 | 115 | 110 | 105 | 100 |
| | | Re450/Re550 | | | | | | 1.09 | | | | | |
| | $\lambda/2$ Retardation Layer | In-Plane Retardation (nm) | 300 | 290 | 280 | 270 | 260 | 250 | 240 | 230 | 220 | 210 | 200 |
| | | Re450/Re550 | | | | | | 1.09 | | | | | |
| Range in which $R_1/R_2$ is substituted for x according to Condition 1 | | | | | | | | 113.4 to 123.4 nm | | | | | |
| Range in which $R_1/R_2$ is substituted for x according to Condition 2 | | | | | | | | 226.7 to 246.7 nm | | | | | |
| Evaluation | Color Tone | | C | C | C | C | C | C | A | B | C | C | C |

TABLE 2

| | | | Experimental Example | | | | | | | | | | |
|---|---|---|---|---|---|---|---|---|---|---|---|---|---|
| | | | 2-1 | 2-2 | 2-3 | 2-4 | 2-5 | 2-6 | 2-7 | 2-8 | 2-9 | 2-10 | 2-11 |
| Display Panel B | Display Element B | $R_1/R_2$ | | | | | | 1.04 | | | | | |
| | | Average Spectral Reflectance (%) | | | | | | 50.0 | | | | | |
| | $\lambda/4$ Retardation Layer | In-Plane Retardation (nm) | 150 | 145 | 140 | 135 | 130 | 125 | 120 | 115 | 110 | 105 | 100 |
| | | Re450/Re550 | | | | | | 1.09 | | | | | |
| | $\lambda/2$ Retardation Layer | In-Plane Retardation (nm) | 300 | 290 | 280 | 270 | 260 | 250 | 240 | 230 | 220 | 210 | 200 |
| | | Re450/Re550 | | | | | | 1.09 | | | | | |
| Range in which $R_1/R_2$ is substituted for x according to Condition 1 | | | | | | | | 114.5 to 124.5 nm | | | | | |
| Range in which $R_1/R_2$ is substituted for x according to Condition 2 | | | | | | | | 228.9 to 248.9 nm | | | | | |
| Evaluation | Color Tone | | C | C | C | C | C | C | A | C | C | C | C |

TABLE 3

| | | | Experimental Example | | | | | | | | | | |
|---|---|---|---|---|---|---|---|---|---|---|---|---|---|
| | | | 3-1 | 3-2 | 3-3 | 3-4 | 3-5 | 3-6 | 3-7 | 3-8 | 3-9 | 3-10 | 3-11 |
| Display Panel C | Display Element C | $R_1/R_2$ | | | | | | 0.78 | | | | | |
| | | Average Spectral Reflectance (%) | | | | | | 48.7 | | | | | |
| | $\lambda/4$ Retardation Layer | In-Plane Retardation (nm) | 150 | 145 | 140 | 135 | 130 | 125 | 120 | 115 | 110 | 105 | 100 |
| | | Re450/Re550 | | | | | | 1.09 | | | | | |
| | $\lambda/2$ Retardation Layer | In-Plane Retardation (nm) | 300 | 290 | 280 | 270 | 260 | 250 | 240 | 230 | 220 | 210 | 200 |
| | | Re450/Re550 | | | | | | 1.09 | | | | | |
| Range in which $R_1/R_2$ is substituted for x according to Condition 1 | | | | | | | | 115.7 to 125.7 nm | | | | | |
| Range in which $R_1/R_2$ is substituted for x according to Condition 2 | | | | | | | | 231.3 to 251.3 nm | | | | | |
| Evaluation | Color Tone | | C | C | C | C | C | B | A | C | C | C | C |

As noted in Tables 1 to 3, it was observed that display panels (Experimental Examples 1-7, 1-8, 2-7, 3-6, and 3-7) satisfying Conditions 1 and 2 can suppress deterioration of the color tone.

REFERENCE SIGNS LIST

10: display element
20: retardation layer
20a: λ/4 retardation layer
20b: λ/2 retardation layer
21: transparent substrate
22: alignment film
23: adhesive layer
25: laminate including retardation layer
30: polarizer
100: display panel

The invention claimed is:

1. A display panel comprising: a display element (A), a retardation layer (B) positioned upon the light emission surface side of the display element, and a polarizer (C) positioned upon the light emission surface side of the retardation layer, wherein the retardation layer (B) includes a λ/4 retardation layer (B1), and the in-plane retardation of the λ/4 retardation layer (B1) satisfies the following condition 1:
<Condition 1>
The spectral reflectance of the display element is measured by a Specular Component Included (SCI) method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/4 retardation layer falls within the range of $-4.6002x+119.24$ nm or more and $-4.6002x+129.24$ nm or less.

2. The display panel according to claim 1, wherein the retardation layer (B) further includes a λ/2 retardation layer (B2), and the in-plane retardation of the λ/2 retardation layer (B2) satisfies the following condition 2:
<Condition 2>
The spectral reflectance of the display element is measured by the SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/2 retardation layer falls within the range of $-9.2004x+238.47$ nm or more and $-9.2004x+258.47$ nm or less.

3. The display panel according to claim 1, wherein the average of spectral reflectance of the display element at wavelengths over the range of 400 nm or more and 700 nm or less measured by the SCI method is 35% or more.

4. The display panel according to claim 1, wherein the display element is an organic EL Element or a microLED element.

5. A display device comprising the display panel according to claim 1.

6. A method of selecting a retardation layer of a display panel comprising, with respect to a display panel including a display element (A), a retardation layer (B) positioned upon the light emission surface side of the display element, and a polarizer (C) positioned upon the light emission surface side of the retardation layer, and in which the retardation layer (B) includes a λ/4 retardation layer (B1), the selection of a λ/4 retardation layer satisfying the following condition 1 as the λ/4 retardation layer (B1):
<Condition 1>
The spectral reflectance of the display element is measured by a Specular Component Included (SCI) method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/4 retardation layer falls within the range of $-4.6002x+119.24$ nm or more and $-4.6002x+129.24$ nm or less.

7. The method according to claim 6, wherein the retardation layer (B) further includes a λ/2 retardation layer (B2), and the method further comprises the selection of a λ/2 retardation layer satisfying the following condition 2 as the λ/2 retardation layer (B2):
<Condition 2>
The spectral reflectance of the display element is measured by the SCI method, the average reflectance at wavelengths over the range of 400 nm or more and less than 550 nm is obtained as $R_1$, the average reflectance at wavelengths over the range of 550 nm or more and less than 700 nm is obtained as $R_2$, and when the value of $R_1/R_2$ is calculated and obtained as x, the in-plane retardation of the λ/2 retardation layer falls within the range of $-9.2004x+238.47$ nm or more and $-9.2004x+258.47$ nm or less.

* * * * *